United States Patent
Sugiyama et al.

(10) Patent No.: US 10,338,144 B2
(45) Date of Patent: Jul. 2, 2019

(54) CALCULATION APPARATUS AND CALCULATION METHOD

(71) Applicant: Kabushiki Kaisha Toshiba, Minato-ku, Tokyo (JP)

(72) Inventors: Nobukatsu Sugiyama, Kanagawa (JP); Ena Ishii, Kanagawa (JP); Tomokazu Morita, Chiba (JP); Mitsunobu Yoshida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 14/615,819

(22) Filed: Feb. 6, 2015

(65) Prior Publication Data

US 2015/0260798 A1    Sep. 17, 2015

(30) Foreign Application Priority Data

Mar. 17, 2014  (JP) ................................. 2014-053134

(51) Int. Cl.
*G01R 31/36*    (2019.01)
*G01R 31/382*   (2019.01)

(52) U.S. Cl.
CPC ....... *G01R 31/3648* (2013.01); *G01R 31/382* (2019.01)

(58) Field of Classification Search
CPC .................. G01R 31/3648; G01R 31/3606

(Continued)

(56) References Cited

U.S. PATENT DOCUMENTS 7,576,545 B2    8/2009  Singh et al.
2003/0099884 A1*  5/2003  Chiang ................. G02F 1/1523
                                              429/233

(Continued)

FOREIGN PATENT DOCUMENTS

EP   2 530 482 A2    12/2012
JP   2003-307556     10/2003

(Continued)

OTHER PUBLICATIONS

Notice of Preliminary Rejection issued by the Korean Intellectual Property Office dated Jan. 15, 2016, for Korean Patent Application No. 10-2015-0012728, and English-language translation thereof.

(Continued)

*Primary Examiner* — Dzung Tran
(74) *Attorney, Agent, or Firm* — Finnegan, Henderson, Farabow, Garrett & Dunner, L.L.P.

(57) ABSTRACT

According to an embodiment, a calculation apparatus includes a first calculator, a second calculator and a third calculator. The first calculator performs a regression analysis to calculate internal state parameters including a quantity of active material and an initial charged capacity of at least the first electrode. The second calculator calculates, based on the internal state parameters, an upper limit charged capacity in a predetermined range based a charged capacity at which an open circuit voltage of the rechargeable battery reaches an upper limit voltage. The third calculator changes the quantity of active material of the first electrode to a fixed value, and recalculates the initial charged capacity of the first electrode used on the fixed value and the upper limit charged capacity.

10 Claims, 8 Drawing Sheets

(58) Field of Classification Search
USPC .......................................................... 702/63
See application file for complete search history.

(56) References Cited

U.S. PATENT DOCUMENTS

| | | | |
|---|---|---|---|
| 2003/0169049 | A1 | 9/2003 | Kawaguchi et al. |
| 2009/0051321 | A1 | 2/2009 | Sato |
| 2009/0326842 | A1 | 12/2009 | Thomas-Alyea |
| 2012/0176092 | A1 | 7/2012 | Fujii et al. |
| 2012/0310566 | A1* | 12/2012 | Hoshino ............ G01R 31/3651 702/63 |
| 2013/0138369 | A1 | 5/2013 | Papana et al. |
| 2013/0302697 | A1* | 11/2013 | Wang .................... B82Y 30/00 429/300 |
| 2014/0222358 | A1 | 8/2014 | Morita et al. |
| 2015/0160300 | A1 | 6/2015 | Ishii et al. |
| 2015/0268306 | A1 | 9/2015 | Sugiyama et al. |

FOREIGN PATENT DOCUMENTS

| | | |
|---|---|---|
| JP | 2009-52925 | 3/2009 |
| JP | 2009-80093 | 4/2009 |
| JP | 2011-75461 | 4/2011 |
| JP | 2012-141202 | 7/2012 |
| JP | 2012-145403 | 8/2012 |
| JP | 2012-247374 | 12/2012 |
| JP | 2012-251806 | 12/2012 |
| JP | 2013-3115 | 1/2013 |
| JP | 2013-89423 | 5/2013 |
| JP | 2014-10003 | 1/2014 |
| JP | 2014-32825 | 2/2014 |
| JP | 2014-190763 | 10/2014 |
| JP | 2015-111086 | 6/2015 |
| JP | 2015-178963 | 10/2015 |
| KR | 10-2013-0126273 | 11/2013 |
| TW | 535308 B | 5/2003 |
| TW | 535308 B | 6/2003 |
| TW | I331417 | 6/2008 |
| TW | 201314236 A | 4/2013 |
| WO | WO 2014/156869 A1 | 10/2014 |

OTHER PUBLICATIONS

Notification of First Office Action issued by the Taiwan Patent and Trademark Office dated Aug. 10, 2016, for Taiwanese Patent Application No. 104100279, and English-language translation thereof.
Notification of First Office Action issued by the Taiwan Patent and Trademark Office dated Aug. 15, 2016, for Taiwanese Patent Application No. 104100279, and English-language translation thereof.

* cited by examiner

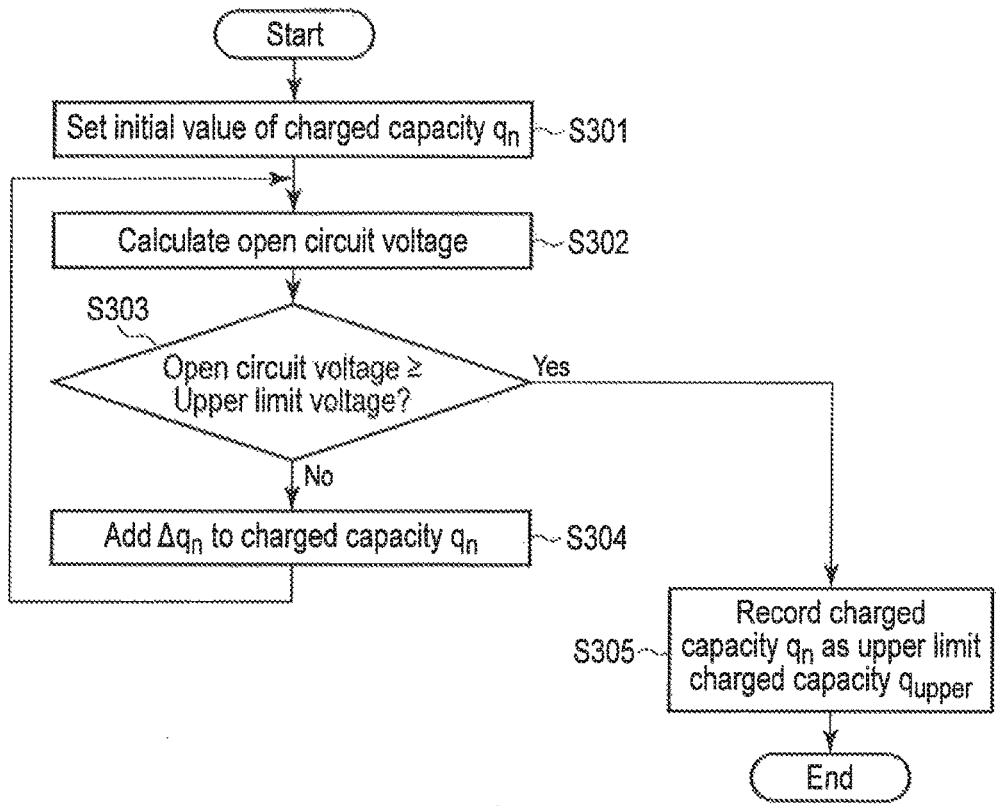
F I G. 4
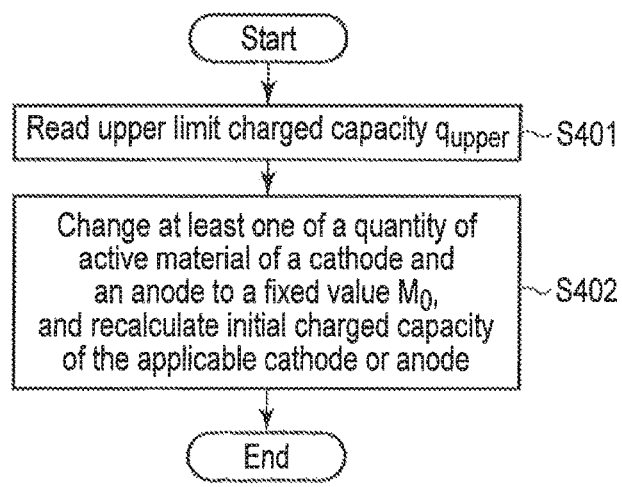
F I G. 5

CALCULATION APPARATUS AND CALCULATION METHOD

CROSS-REFERENCE TO RELATED APPLICATIONS

This application is based upon and claims the benefit of priority from Japanese Patent Application No. 2014-053134, filed Mar. 17, 2014, the entire contents of which are incorporated herein by reference.

FIELD

Embodiments described herein generally relate to a calculation apparatus and a calculation method for calculating internal state parameters of a rechargeable battery.

BACKGROUND

A technique of estimating an internal state of a rechargeable battery by performing regression analysis on a charging curve of the rechargeable battery has conventionally been proposed. However, in such a regression analysis, it is difficult to estimate an internal state of the rechargeable battery with high accuracy, especially when charging the rechargeable battery at a high rate, without considering any influence of a diffusion resistance of an active material in a case where the diffusion resistance is small. On the other hand, if the influence of the diffusion resistance of the active material is taken into consideration when estimating the internal state of the rechargeable battery, an amount of calculation and working area (a storage area temporarily used for data processing) required would be increased.

BRIEF DESCRIPTION OF THE DRAWINGS

FIG. 4 is a flow chart illustrating a process of calculating an upper limit charged capacity performed by the upper limit charged capacity calculator shown in FIG. 1.

FIG. 5 is a flowchart illustrating a process of calculating an initial charged capacity performed by the initial charged capacity calculator shown in FIG. 1.

DETAILED DESCRIPTION

Figure 1:
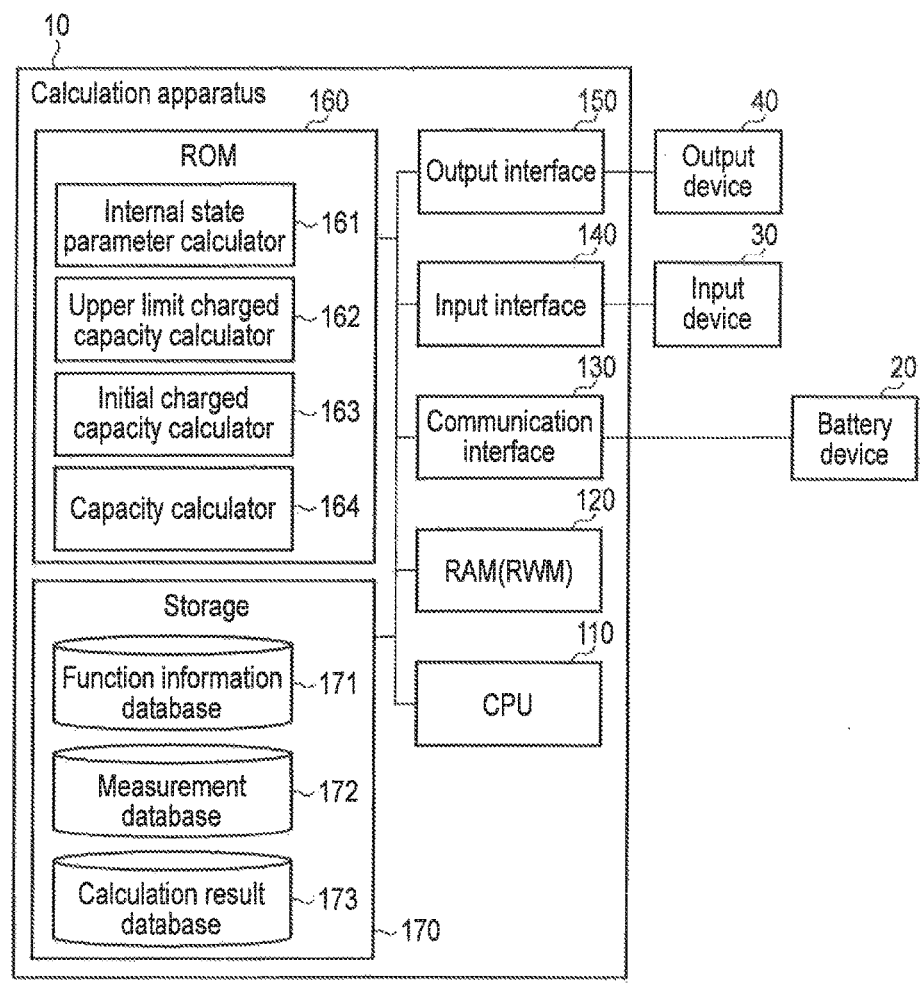
FIG. 1 is a block diagram illustrating a calculation apparatus according to the first embodiment.

Embodiments will be described hereinafter with reference to the drawings.

According to an embodiment, a calculation apparatus includes a first calculator, a second calculator and a third calculator. The first calculator performs a regression analysis on a temporal change in a terminal voltage value of a rechargeable battery including a first electrode and a second electrode to calculate internal state parameters including a quantity of active material and an initial charged capacity of at least the first electrode. The second calculator calculates, based on the internal state parameters, an upper limit charged capacity in a predetermined range based a charged capacity at which an open circuit voltage of the rechargeable battery reaches an upper limit voltage. The third calculator changes the quantity of active material of the first electrode to a fixed value, and recalculates the initial charged capacity of the first electrode based on the fixed value and the upper limit charged capacity.

In the drawings, the same constituent elements are denoted by the same respective reference numbers, thus redundant explanations thereof are omitted.

(First Embodiment)

The calculation apparatus according to the first embodiment is illustrated in FIG. 1. The calculation apparatus 10 comprises a CPU (Central Processing Unit) 110, a RAM (Random Access Memory) 120, (which may be replaced with a RWM (Read Write Memory) 120), a communication interface 130, an input interface 140, an output interface 150, a ROM (Read-only memory), and a storage 170. The calculation apparatus 10 may include a timer to measure time and an interface to mount an external storage device (e.g., an SD card and a USB (Universal Serial Bus) memory, etc.) thereon.

The calculation apparatus 10 collects data of various measurements (e.g., a voltage, a current, a charged capacity, etc.) from the battery device 20 through the communication interface 130. The calculation apparatus 10 calculates a variety of parameters, including internal state parameters which will be described later, of a battery device 20 (e.g., an open circuit voltage, a capacity, etc.) based on the data of collected measurements.

The CPU 110 reads a variety of programs stored in the ROM 160 in advance, loads the programs to the RAM 120, and executes the program, thereby operating the calculation apparatus 10 as a variety of function units (an internal state parameter calculator 161, an upper limit charged capacity calculator 162, an initial charged capacity calculator 163, and a capacity calculator 164). However, some or all of these function units may be implemented using hardware such as a dedicated circuit.

The CPU 110 can include a built-in memory having a RAM function. The CPU 110 can include more than one CPU.

The RAM 120 is used as a working area when the CPU 110 performs a variety of programs. For example, the RAM 120 temporarily stores data required for processing according to a variety of programs.

The communication interface 130 exchanges data with the battery device 20. Particularly, the communication interface 130 receives the measurement data from the battery device 20. The communication interface 130 may be implemented using a router, etc., for example. The communication interface 130 may perform either a wired communication or a wireless communication with the battery device 20. The communication interface 130 may communicate with the battery device 20 on a one-way communicable network or two-way communicable network (e.g., CAN (Controller Area Network), Ethernet).

The input device 30 is connected to the calculation apparatus 10 via the input interface 140. The input interface 140 may have an input control function to supply input signals received from the input device 30 to the calculation apparatus 10 after converting the input signals in a format that is recognizable by the CPU 110. It should be noted that the input interface 140 may be implemented using, for example, a terminal, etc., but the input interface 140 can be omitted in a case where the input device 30 is directly coupled to the wiring in the calculation apparatus 10.

The output interface 150 connects the output device 40 to the calculation apparatus 10. For example, if the output device 40 is a display device, the CPU 110 may, for example, control a display controller for the display device via the output interface 150. Or, a display controller (e.g., a graphic board) provided external to the calculation apparatus 10 may control the display device.

The ROM 160 stores a variety of programs. Specifically, the ROM 160 stores programs that have the CPU 110 function as the internal state parameter calculator 161, the upper limit charged capacity calculator 162, the initial charged capacity calculator 163, and the capacity calculator 164.

The ROM 160 may store programs such as a display program to display image data on the output device 40 as texts and figures that can be recognized by a person, a conversion program to convert data in a format supported by the output device 40, and an information registration program to store data outputted by the output device 40 in the storage 170 at a predetermined time.

The ROM 160 may be replaced with a different type of a storage medium. Such storage medium is preferably a transitory storage medium on which data is not rewritable, but may be a storage medium on which data is readable and writable as needed (e.g., a semiconductor memory).

The storage 170 is implemented in a non-volatile storage medium, such as hard disk drive (HDD). It should be noted that the storage 170 is not always implemented in a non-volatile medium; it can be implemented in a semiconductor memory, such as a flash memory, or in a combination of HDD and a semiconductor memory. Furthermore, the ROM 160 and the storage 170 may be configured either separately or integrally.

Various databases, including a function information database 171, a measurement database 172, and a calculation result database 173, are generated in the storage 170. The storage 170 may further store data required for the calculation process performed by the CPU 110. These various databases may also be generated at a storage device that is provided external to the calculation apparatus 10 in a cloud computing system, not at the storage 170. In this case, the storage 170 may be omitted.

Figure 8:
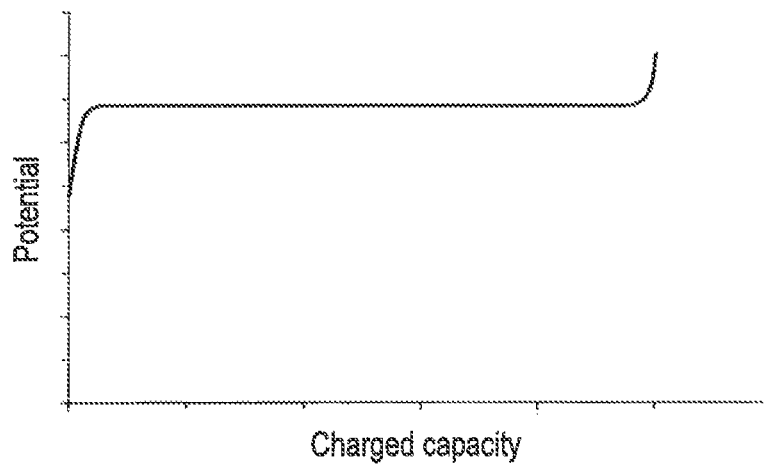
FIG. 8 is a graph illustrating a function describing the relationship between a charged capacity and a potential at a cathode of the rechargeable battery managed by the function information database shown in FIG. 1.
Figure 9:
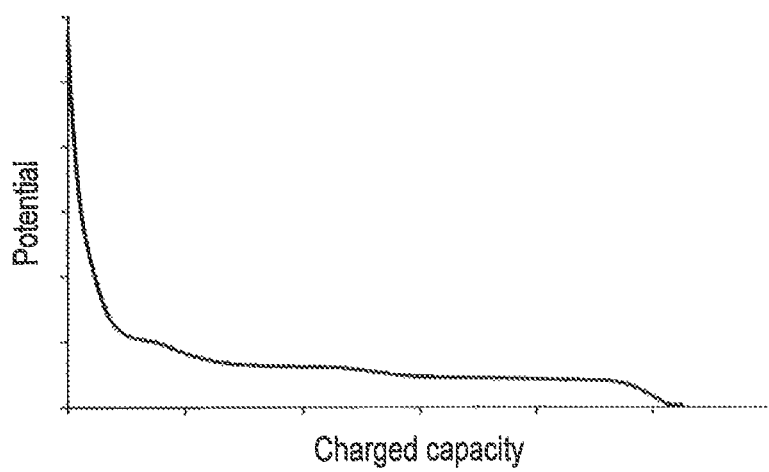
FIG. 9 is as graph illustrating a function describing the relationship between a charged capacity and a potential at an anode of the rechargeable battery managed by the function information database shown in FIG. 1.

The function information database 171 manages the relationship between a charged capacity and a potential at a cathode of the rechargeable battery and the relationship between a charged capacity and a potential at an anode of the rechargeable battery in a table format, for example. These relationships may also be stored in other formats, such as functions, values, and lookup tables. FIG. 8 shows the function describing the relationship between the charged capacity and the potential at the cathode of the rechargeable battery, and FIG. 9 shows the function describing the relationship between the charged capacity and the potential at the anode of the rechargeable battery.

Figure 10:
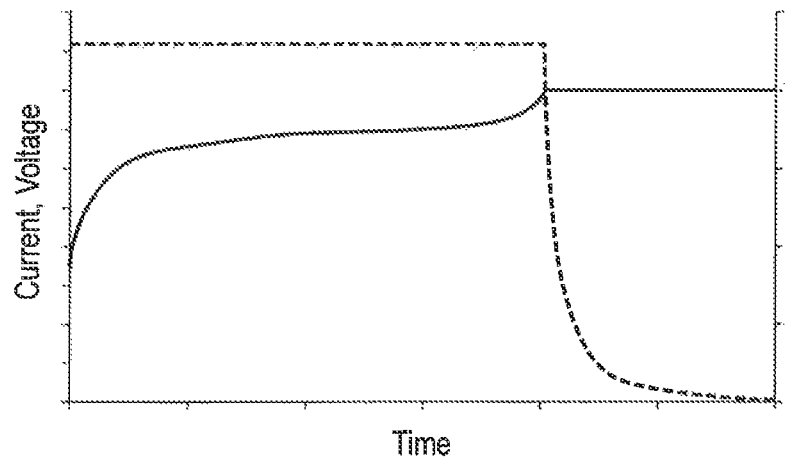
FIG. 10 is a graph illustrating a function describing the temporal change in a voltage and a current during a period of charging the rechargeable battery. The graph is plotted based on data managed by the measurement database shown in FIG. 1.

The measurement database 172 manages the relationship between the measurements of the rechargeable battery, such as current, voltage, and charged capacity, and the measurement times in a table format. The measurement times may be set to be in accordance with a predetermined measurement interval, for example. For example, the CPU 110 can make an inquiry about a plurality of measurement times that belong to the charging or discharging period of the rechargeable battery and the current values and voltage values associated with the measurement times in the measurement database 172, and the graph shown in FIG. 10 can be generated by plotting the values. In FIG. 10, the solid line represents the voltage values, and the broken line represents the current values. The data managed by the measurement database 172 is used by the internal state parameter calculator 161.

The calculation result database 173 manages various values calculated by the CPU 110 (e.g., internal state parameters, an upper limit charged capacity, an open circuit voltage and a capacity, etc.) in a table format, for example. The CPU 110 may extract those values from the calculation result database 173, and may output the values on the output device 40 via the output interface 150.

Figure 2:
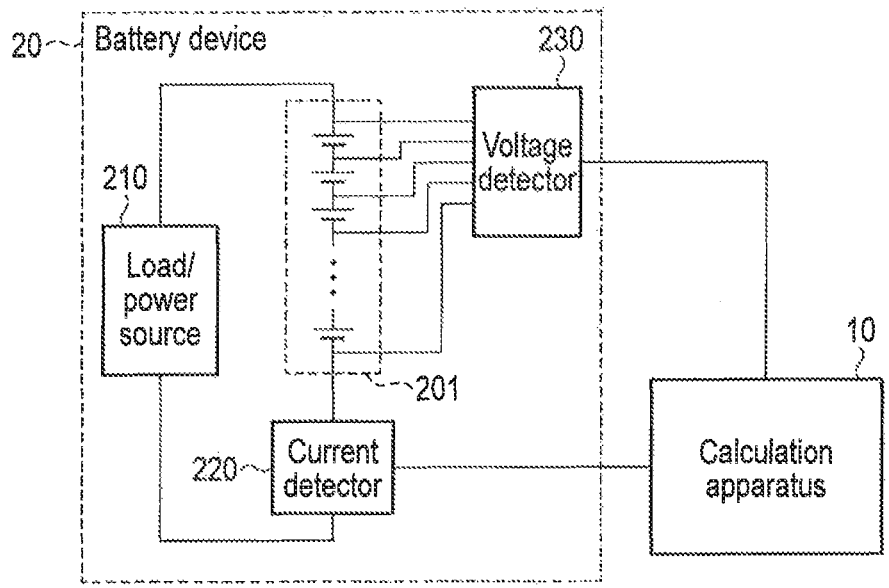
FIG. 2 is a block diagram illustrating a battery device coupled to the calculation apparatus shown in FIG. 1.

The battery device 20 comprises a rechargeable battery 201, a load (or a power supply) 210, a current detector 220, and a voltage detector 230, as illustrated in FIG. 2. Some or all of the elements constituting the battery device 20, except for the rechargeable battery 201, may be provided outside the battery device 20 (for example, inside the calculation apparatus 10).

Figure 3:
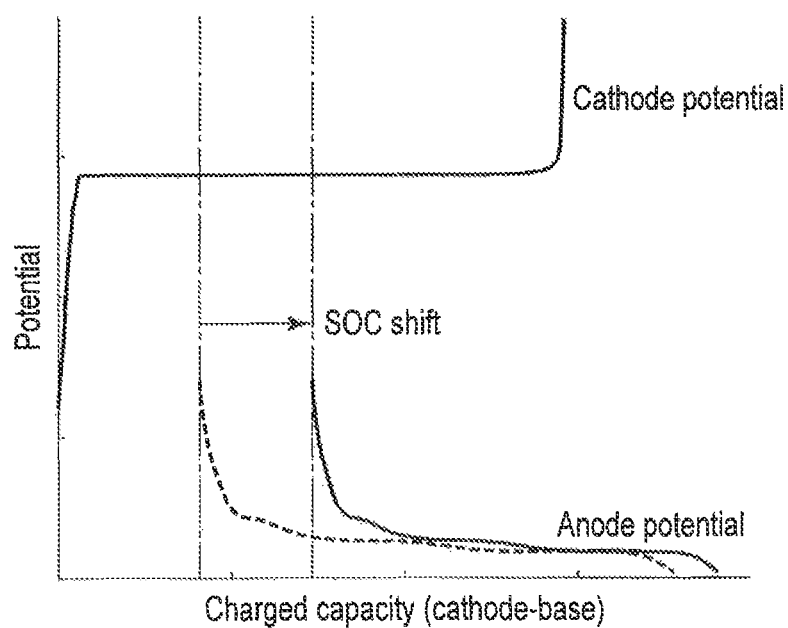
FIG. 3 is an explanatory drawing of an SOC (State of Charge) shift that may occur at the rechargeable battery in FIG. 2.

The rechargeable battery 201 may be various types of rechargeable batteries, such as a lithium ion battery. A rechargeable battery having a characteristic of the degradation of capacity due to a shift in a combination of SOCs of a cathode and an anode, as shown in FIG. 3, which is greater than the degradation of capacity due to reduction in the quantity of active materials of a cathode or an anode, is preferable for the present embodiment. For example, a rechargeable battery containing an iron phosphate as a cathode material (particularly a cathode active material) and a graphite as an anode material (particularly an anode active material) has such a characteristic. If the anode material is a carbon material (e.g., a graphite-type carbon including artificial graphite or natural graphite, and non-crystallized type carbon), a rechargeable battery is prone to have a shift in a combination of SOCs, because lithium is deposited or inactivated when charging the rechargeable battery. However, the present embodiment is applicable in a case where the rechargeable battery 201 does not have such a characteristic.

The rechargeable battery 201 may be a battery module, such as an assembled battery consisting of multiple battery cells. In this case, the measurement and calculation of various parameters may be performed in a unit of a battery cell, or in a unit of a battery module. Usually, since the progress and characteristics of degradation do not necessarily match among multiple battery cells included in a battery module, the measurement and calculation of various parameters is preferably performed in a unit of a battery cell.

When discharging the rechargeable battery 201, a load 210 is connected to consume the power of the rechargeable battery 201. On the other hand, when charging the rechargeable battery 201, a power supply 210 is connected to supply power to the rechargeable battery 201.

The current detector 220 detects a value of the current that flows in the rechargeable battery 201. The current detector 220 outputs the detected current value to the calculation apparatus 10.

The voltage detector 230 detects a value of a voltage between the cathode terminal and anode terminal of the rechargeable battery 201 (i.e., a terminal voltage). The voltage detector 230 outputs the detected voltage value to the calculation apparatus 10.

The current detector 220 and the voltage detector 230 are operated while charging or discharging the rechargeable battery 201. The period of charging or discharging the rechargeable battery 201 can be specified by an arbitrary technique.

The input device 30 may be any kind of input device that is generally provided with a computer device (e.g., a keyboard, a numeric key pad, a button). The input device 30 may have a function of generating input signals by recognizing human speech or other sounds. The input device 30 may be built into the calculation apparatus 10.

The output device 40 may be a display device (e.g., a liquid crystal display, an organic Electro Luminescence (EL) display, a plasma display, etc.). The output device 40 may be a controller that controls the battery device 20 based on instructions from the calculation apparatus 10. The output device 40 may be built into the calculation apparatus 10.

Figure 11:
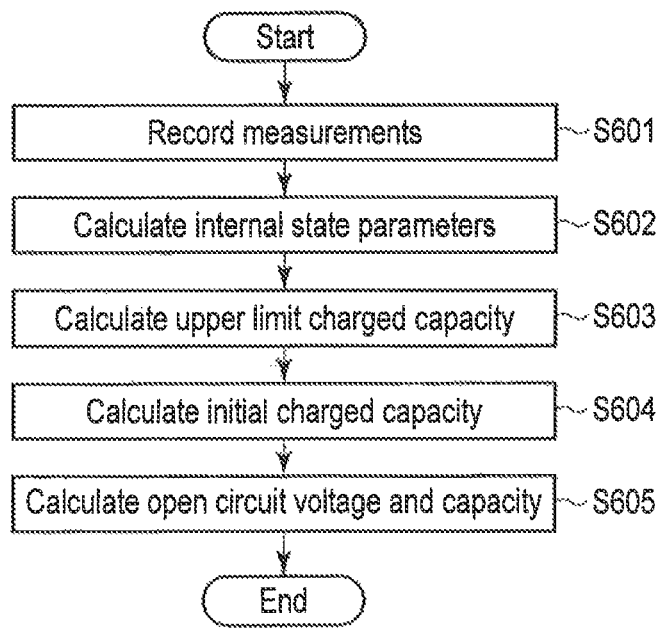
FIG. 11 is a flowchart illustrating the operation of the calculation apparatus shown in FIG. 1.

In sum, the calculation apparatus 10 in FIG. 1 operates as shown in FIG. 11. First, the CPU 110 collects measurement data of the rechargeable battery 201 (e.g., current value, voltage value, and charged capacity) from the battery device 20, and stores the data in the measurement database 172 after associating the data with the measurement time data (step S601). In step S601, the measurement time data and the measurement data can be temporarily stored in the RAM 120 before being stored in the measurement database 172. Regarding the measurement data, the charged capacity is set to zero at the time of a first measurement for example, and a charged capacity at the time of the other measurements is calculated as a time integral value of a current. A charged capacity may be calculated by the CPU 110, or by a calculator (not shown) in the battery device 20.

The internal state parameter calculator 161 calculates internal state parameters by performing a regression analysis on the measurement data stored in step S601 (step S602). The internal state parameters include a quantity of active material and an initial charged capacity of the cathode, and a quantity of active material and an initial charged capacity of the anode. It should be noted that the quantity of active material of at least one of the cathode and the anode (in other words, at least the first electrode) is changed to a fixed value that is predetermined at step S604, and the initial charged capacity of at least the first electrode is recalculated at the same step.

The upper limit charged capacity calculator 162 calculates an upper limit charged capacity that is approximately the same as the charged capacity of the time when an open circuit voltage of the rechargeable battery 201 reaches an upper limit voltage (will be described later) (in other words, an upper limit charged capacity that falls under a predetermined range with reference to the charged capacity) based on the internal state parameters calculated at step S602 (step S603).

The initial charged capacity calculator 163 changes the quantity of active material of at least one of the cathode or the anode (i.e., at least the first electrode) calculated at step S602 to a fixed value, and recalculates the initial charged capacity of at least the first electrode using the upper limit charged capacity calculated at step S603 (step S604).

The capacity calculator 164 calculates an open circuit voltage of a rechargeable battery 201 corresponding to a plurality of charged capacities and a capacity of the rechargeable battery 201, using the internal state parameters calculated at step S602 (except for the quantity of active material changed to the fixed value and the recalculated initial charged capacity at step S604), the quantity of active material changed to the fixed value, and the recalculated initial charged capacity at step S604 (step S605).

Specifically, the internal state parameter calculator 161 calculates five internal state parameters of the rechargeable battery 201: a quantity of the cathode (in particular, a quantity of an cathode active material), a quantity of the anode (in particular, a quantity of an anode active material), an initial charged capacity of the cathode, an initial charged capacity of the anode, and an internal resistance. In the following explanation, it is assumed that each of the cathode and the anode is composed of one active material for the sake of brevity; however, the present embodiment is applicable to a cathode and an anode, each composed of multiple active materials.

When each of the cathode and the anode of the rechargeable battery 201 is made of a single kind of active material, the terminal voltage value at the time of charging or discharging the rechargeable battery 201 can be expressed in the equation (1) below:

$$V_t = f_c\left(q^c0 + \frac{q_t}{M_c}\right) - f_a\left(q^a0 + \frac{q_t}{M_a}\right) + RI_t \quad (1)$$

In the equation (1), $V_t$ is a variable representing a terminal voltage value at a measurement time t, $f_c(\ )$ is a function describing the relationship between a charged capacity and a potential at the cathode of the rechargeable battery 201, and is managed by the function information database 171. Furthermore, $q^c_0$ is a variable that represents an initial charged capacity of the cathode, and $q_t$ represents a charged capacity of the rechargeable battery 201 at the time t, and recorded in the measurement database 172. It should be noted that it is not always necessary to record $q_t$ in the measurement database 172. The value $q_t$ can be derived by performing temporal integration on, for example, current values of the rechargeable battery 201 which are recorded in the measurement database 172. In the equation (1), $M_c$ is a variable representing a quantity of active material of the cathode, and $f_a(\ )$ is a function describing the relationship between a charged capacity and a potential at the anode of the rechargeable battery 201, and is managed by the function information database 171. Furthermore, $q^a_0$ is a variable representing an initial charged capacity of the anode, $M_a$ is a variable representing a quantity of active material of the anode, and R is a variable representing an internal resistance. $I_t$ represents a current value of the rechargeable battery 201 at the time t, and is recorded in the measurement database 172.

The internal state parameter calculator 161 calculates internal state parameters by performing a regression analysis in a manner such that a residual error between a terminal voltage value of the rechargeable battery 201 recorded in the measurement database 172 being associated with a given measurement time and a terminal voltage value calculated by the equation (1) is reduced. The internal state parameter calculator 161 may calculate internal state parameters that minimize a residual error E in a format of a sum of squared errors indicated in the equation (2) below:

$$E = \sum_{t=t_0}^{t_{end}} \left( V_{bat\_t} - \left( f_c\left(q^c 0 + \frac{q_t}{M_c}\right) - f_a\left(q^a 0 + \frac{q_t}{M_a}\right) + RI_t \right) \right)^2 \quad (2)$$

In the equation (2) below, E represents a residual error, $t_0$ represents a measurement time corresponding to a starting point of a period which is a target for the regression analysis, $t_{end}$ represents a measurement time corresponding to an ending point of the period, and $V_{bat\_t}$ represents a terminal voltage value of the rechargeable battery 201 at the time t and is recorded in the measurement database 172. The period which is a target for regression analysis should preferably be a CC (Constant Current) charging period or CC discharging period from the viewpoint of suppressing adverse influences due to an error in the measurements (e.g., errors in calculated parameters); however, it may be other periods as well.

The internal state parameter calculator 161 can utilize a variety of algorithms to calculate internal state parameters to minimize a residual error. The internal state parameter calculator 161 can calculate internal state parameters utilizing a first-order differential, like a Gauss-Newton method or Levenberg-Marquardt method, for example, and can calculate internal state parameters utilizing a metaheulistic algorithm such as a particle swarm optimization and a genetic algorithm.

The upper limit charged capacity calculator 162 operates as illustrated in FIG. 4 to calculate an upper limit charged capacity corresponding to an upper limit voltage of the rechargeable battery 201, using the quantity of active material and the initial charged capacity of the cathode and the quantity of active material and the initial charged capacity of the anode calculated by the internal state parameter calculator 161. The processing illustrated in FIG. 4 begins after, for example, the process at the internal state parameter calculator 161 is finished.

When the process illustrated in FIG. 4 begins, the upper limit charged capacity calculator 162 sets an initial value of the charged capacity $q_n$ (i.e., a value first given to the charged capacity $q_n$ as a variable) (step S301). Any arbitrary value can be set as an initial value of this charged capacity $q_n$. The upper limit charged capacity calculator 162 can set a maximum value among the charged capacities recorded in the measurement database 172, or a maximum value among the charged capacities calculated by the CPU 110 or a calculator (not shown) inside of the calculation apparatus 10 using a current value, etc. recorded on the measurement database 172, for example, as an initial value. By setting the initial value with the above-mentioned manner, it is possible to search efficiently for an upper limit charged capacity. The process proceeds to step S302 after step S301.

In step S302, the upper limit charged capacity calculator 162 calculates an open circuit voltage of the rechargeable battery 201 by, for example, the equation (3) below:

$$E_n = f_c\left(q^c 0 + \frac{q_n}{M_c}\right) - f_a\left(q^a 0 + \frac{q_n}{M_a}\right) \quad (3)$$

In the equation (3), $E_n$ represents an open circuit voltage of the rechargeable battery 201 when a charged capacity $q_n$ is given. As described above, $f_c( )$ and $f_a( )$ are managed by the function information database 171. The values $q^c_0$, $M_c$, $q^a_0$, and $M_a$ are calculated by the internal state parameter calculator 161. The symbol $q_n$ is a variable representing a charged capacity, and is initialized at step S301, and is updated at step 304 which will be described later.

If the open circuit voltage calculated at step S302 is not lower than a predetermined upper limit voltage, the process proceeds to step S305; if not, the process proceeds to step S304 (step S303). This upper limit voltage corresponds to an upper limit value of a range of a predetermined voltage available for the open circuit voltage of the rechargeable battery 201, for example. An appropriate range of the voltage is determined in advance for each of the cathode active material and the anode active material of the rechargeable battery 201 from the view point of safety, lifespan, and resistance, etc. For this reason, the upper limit voltage of the rechargeable battery 201 is determined by a combination of types of the cathode active material and the anode active material of the rechargeable battery 201. For example, a greater value of the upper limit value of a range of voltage determined by the cathode active material of the rechargeable battery 201 or the upper limit value of a range of voltage determined by the anode active material of the rechargeable battery 201 can be defined as the upper limit voltage.

In step S304, the upper limit charged capacity calculator 162 adds $\Delta q_n$ to the charged capacity $q_n$. The value $\Delta q_n$ is an adjustment width of the charged capacity $q_n$, and it is configurable at any arbitrary value. The upper limit charged capacity calculator 162 may use $\Delta q_n$ which has a value in the range of 1/1000 to 1/100 of a nominal capacity of the rechargeable battery 201, for example. Specifically, when the nominal capacity of the rechargeable battery 201 is 1000 mAh, $\Delta q_n$ may be set at a value in the range of 1 mAh to 10 mAh.

In step S305, the upper limit charged capacity calculator 162 records a current charged capacity $q_n$ (i.e., a value within the range of $\pm \Delta q_n$ based a charged capacity when the open circuit voltage of the rechargeable battery 201 reaches an upper limit voltage) in the calculation result database 173 as an upper limit charged capacity $q_{upper}$, and the process shown in FIG. 4 is finished.

The initial charged capacity calculator 163 operates as shown in FIG. 5 in order to change at least one of the quantity of active material of the cathode and the anode (i.e., at least the first electrode) calculated at step S602 into a fixed value, and to recalculate the initial charged capacity of the applicable first electrode, using the quantity of active material and initial charged capacity of at least the first electrode and the upper limit charged capacity calculated at step S603 (step S604). The process shown in FIG. 5 begins after the process at the upper limit charged capacity calculator 162, for example, is finished.

The initial charged capacity calculator 163 changes one of the quantity of active material of the cathode or the anode with a smaller amount of reduction of the active material at the time of degradation (i.e., either the cathode or the anode which has less degradation due to the reduction of quantity of active material) to a fixed value, and recalculates an initial charged capacity of the one of them. For example, if the rechargeable battery 201 contains iron phosphate as the cathode active material and graphite as the anode active material, the initial charged capacity calculator 163 preferably changes the quantity of active material of the cathode to a fixed value, and recalculates an initial charged capacity of the cathode. Even if such quantity of active material is changed to a fixed value, the accuracy in estimation of the internal state of the rechargeable battery 201 hardly decreases; rather, the accuracy in estimation of the internal state of the rechargeable battery 201 improves by recalculating the initial charged capacity with a high degree of accuracy based on the fixed value.

For brevity, the following explanation will be based on the assumption that the initial charged capacity calculator 163 changes the quantity of active material of the cathode to a fixed value, and recalculates the initial charged capacity thereof; however, in actual implementation, the initial charged capacity calculator 163 can change the quantity of active material of the anode to a fixed value, and can recalculate the initial charged capacity thereof, or can change each of the quantity of active material of the cathode and the anode to a fixed value, and can recalculate the initial charged capacity of each of the cathode and the anode.

When the process shown in FIG. 5 begins, the initial charged capacity calculator 163 reads the upper limit charged capacity $q_{upper}$ calculated by the upper limit charged capacity calculator 162 from the calculation result database 173 (step S401). Then, the initial charged capacity calculator 163 changes the quantity of active material of the cathode calculated by the internal state parameter calculator 161 to a fixed value. Furthermore, the initial charged capacity calculator 163 recalculates the initial charged capacity of the cathode based on the upper limit charged capacity $q_{upper}$ read at step S401, the initial charged capacity $q^c_0$ and quantity of active material $M_c$ of the cathode calculated by the internal state parameter calculator 161, and the quantity of active material $M_0$ corresponding to the above fixed value (step S402). Specifically, the initial charged capacity calculator 163 can recalculate the initial charged capacity of the cathode based on the equation (4) below:

$$q^c 0' = q^c 0 + \frac{q_{upper}}{M_c} - \frac{q_{upper}}{M_0} \quad (4)$$

Figure 6:
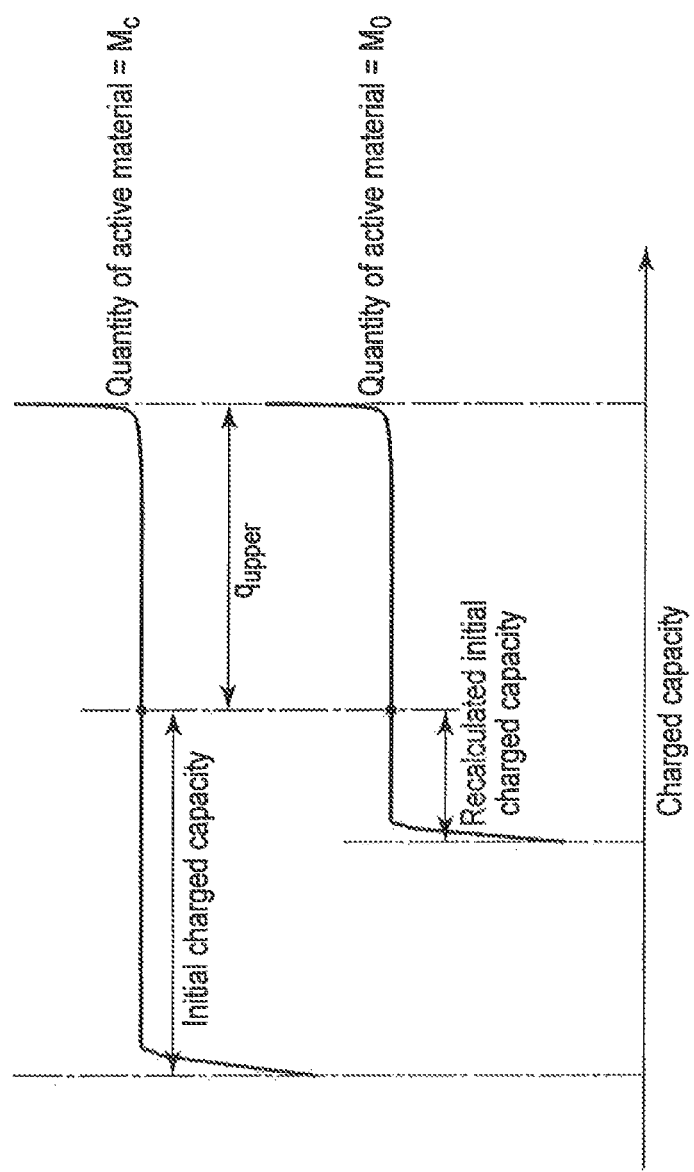
FIG. 6 is an explanatory drawing of the process of calculating an initial charged capacity performed by the initial charged capacity calculator shown in FIG. 1.

In the equation (4), $q^c_0{}'$ represents the recalculated initial charged capacity of the cathode. According to the equation (4), $q^c_0{}' \neq q^c_0$ except for the case where $M_c = M_0$. According to the equation (4), as illustrated in FIG. 6, the initial charged capacity calculator 163 recalculates the initial charged capacity of the cathode so that the open circuit voltage (approximately equal to an upper limit voltage) of the rechargeable battery 201 corresponding to the upper limit charged capacity $q_{upper}$ does not change before and after changing the quantity of active material of the cathode to the fixed value. As the open circuit voltage can be calculated by the above equation (3), the equation (4) below can be derived.

$$f_c\left(q^c 0' + \frac{q_{upper}}{M_0}\right) - f_a\left(q^a 0 + \frac{q_{upper}}{M_a}\right) = f_c\left(q^c 0 + \frac{q_{upper}}{M_c}\right) - f_a\left(q^a 0 + \frac{q_{upper}}{M_a}\right)$$

$$f_c\left(q^c 0' + \frac{q_{upper}}{M_0}\right) = f_c\left(q^c 0 + \frac{q_{upper}}{M_c}\right)$$

$$q^c 0' + \frac{q_{upper}}{M_0} = q^c 0 + \frac{q_{upper}}{M_c}$$

$$q^c 0' = q^c 0 + \frac{q_{upper}}{M_c} - \frac{q_{upper}}{M_0}$$

It should be noted that the above quantity of active material $M_0$ can be an arbitrary fixed value; however, it may be determined based on the nominal capacity of the rechargeable battery 201 and the maximum charged capacity per unit mass (e.g., 1 g) of the active material. Specifically, the nominal capacity of the rechargeable battery 201 is 1000 mAh, and the full charge capacity per unit mass of the active material is 100 mAh/g, the quantity of active material $M_0$ can be set at a fixed value within the range of 10 to 15, for example. Or, the above quantity of active material $M_0$ can be set at a fixed value equal to the quantity of active material calculated in advance by the internal state parameter calculator 161 based on a temporal change in a terminal voltage value measurement at the time of low-rate charging of the rechargeable battery 201.

Figure 7:
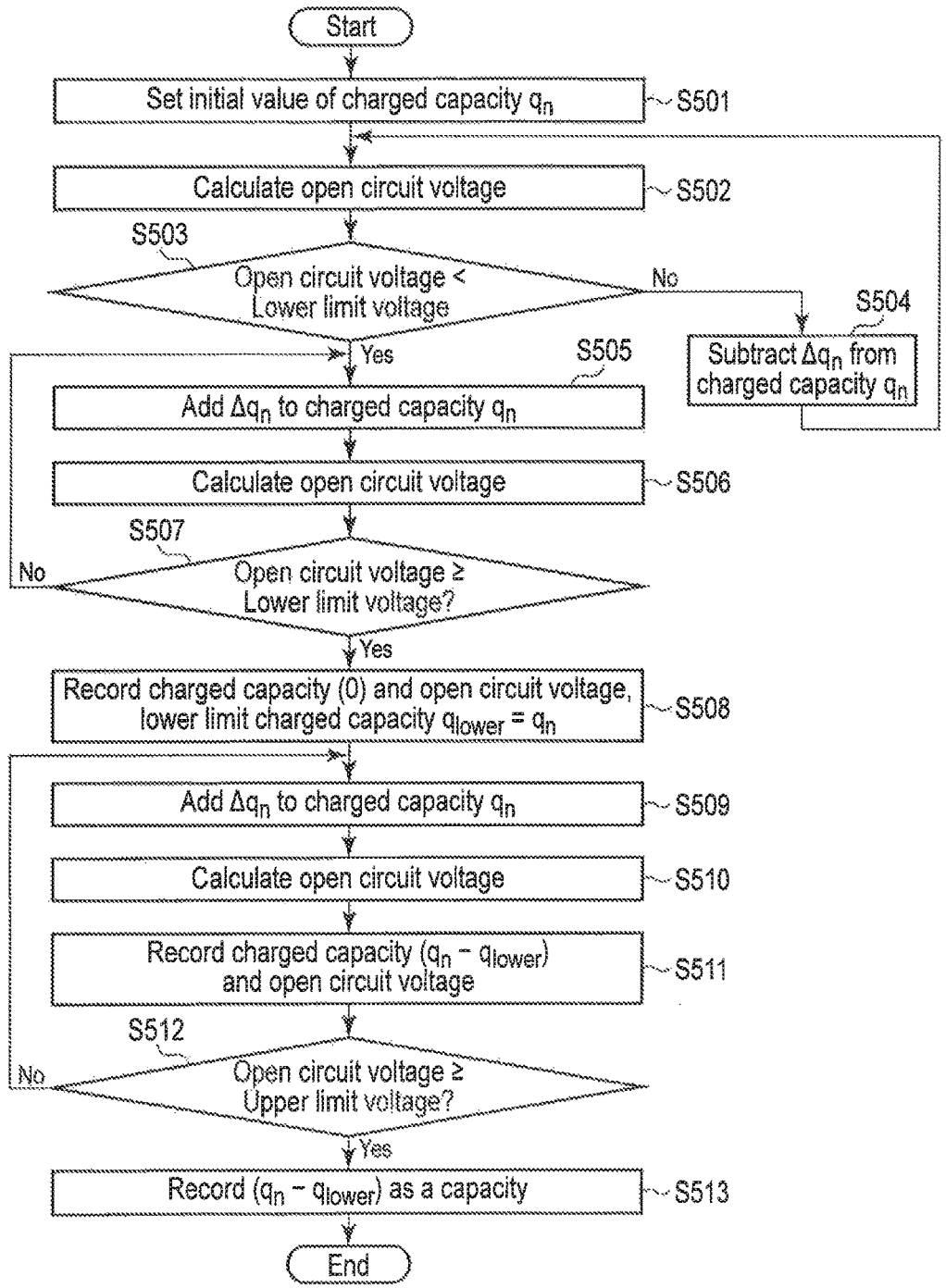
FIG. 7 is an explanatory drawing of the capacity calculation process performed by the capacity calculator shown in FIG. 1.

The capacity calculator 164 is operated as illustrated in FIG. 7 to calculate open circuit voltages of a rechargeable battery 201 corresponding to a plurality of charged capacities and a capacity of the rechargeable battery 201, using the internal state parameters calculated by the internal state parameter calculator 161 (except for the quantity of active material changed to the fixed value and the initial charged capacity recalculated by the initial charged capacity calculator 163), the quantity of active material changed to the fixed value by the initial charged capacity calculator 163, and the initial charged capacity recalculated by the initial charged capacity calculator 163. The process shown in FIG. 7 begins after the process at the initial charged capacity calculator 163, for example, is finished.

When the process illustrated in FIG. 7 begins, the capacity calculator 164 sets an initial value of the charged capacity $q_n$ (i.e., a value first given to the charged capacity $q_n$ as a variable) (step S501). Any arbitrary value can be set as an initial value of this charged capacity $q_n$. The capacity calculator 164 may set a value that can be derived based on, for example, the initial charged capacity and the quantity of active material of the cathode or anode calculated by the internal state parameter calculator 161 for the charged capacity $q_n$ as an initial value. For example, if the initial charged capacity of the cathode or anode is 10 mAh/g, and the quantity of active material is 10 g, the capacity calculator 164 can set a value in the range of minus 100 to minus 50 for the charged capacity $q_n$ as an initial value. The process proceeds to step S502 after S501.

In step S502, the capacity calculator 164 calculates an open circuit voltage of the rechargeable battery 201 by, for example, the equation (3) above. However, it should be noted that at least one of $M_c$ and $M_a$ (i.e., the quantity of active material of at least the first electrode) is changed to a fixed value by the initial charged capacity calculator 163, and at least one of $q^c_0$ and $q^a_0$ (i.e., the initial charged capacity of at least the first electrode) is recalculated by the initial charged capacity calculator 163. The variable $q_n$ representing a charged capacity, is initialized at step S501, and is updated at step S504, step S505, and step S509.

If the open circuit voltage calculated at step S502 is smaller than a predetermined lower limit voltage, the process proceeds to step S505; if not, the process proceeds to step S504 (step S503). This lower limit voltage corresponds to a lower limit value of a range of predetermined voltage available for the open circuit voltage of the rechargeable battery 201, for example. An appropriate range of the voltage is determined in advance for each of the cathode active material and the anode active material of the rechargeable battery 201 from the view point of safety, lifespan, and resistance, etc. For this reason, the lower limit voltage of the rechargeable battery 201 is determined by a combination of types of the cathode active material and the anode active material of the rechargeable battery 201.

In step S504, the capacity calculator 164 subtracts $\Delta q_n$ from the charged capacity $q_n$. The value $\Delta q_n$ is an adjustment width of the charged capacity $q_n$, and it is configurable at any arbitrary value. The capacity calculator 164 may use $\Delta q_n$ which has a value in the range of 1/1000 to 1/100 of a nominal capacity of the rechargeable battery 201, for example. Specifically, when the nominal capacity of the rechargeable battery 201 is 1000 mAh, $\Delta q_n$ may be set at a value in the range of 1 mAh to 10 mAh. The process returns to step S502 after S504.

In step S505, the capacity calculator 164 adds $\Delta q_n$ to the charged capacity $q_n$. Next, the capacity calculator 164 calculates an open circuit voltage of the rechargeable battery 201 (step S506). If the open circuit voltage calculated at step S506 is not lower than the aforementioned lower limit voltage, the process proceeds to step S508; if not, the process returns to step S505 (step S507).

In step S508, the capacity calculator 164 records a current charged capacity $q_n$ (i.e., a value within the range of $\pm \Delta q_n$ based a charged capacity when the open circuit voltage of the rechargeable battery 201 reaches a lower limit voltage) in the calculation result database 173 as a lower limit charged capacity $q_{lower}$, and further records the open circuit voltage calculated at step S506 based on the current charged capacity $q_n$ in the calculation result database 173, associating it with a $q_{lower}$-based charged capacity=0. The process proceeds to step S509 after S508.

In step S509, the capacity calculator 164 adds $\Delta q_n$ to the charged capacity $q_n$. Next, the capacity calculator 164 calculates an open circuit voltage of the rechargeable battery 201 (step S510). Next, the capacity calculator 164 records the open circuit voltage calculated at step S510 based on $q_n$ of the current charged capacity in the calculation database 173, associating it with charged capacity=$q_n$-$q_{lower}$ (step S511). If the open circuit voltage calculated at step S510 is not lower than the aforementioned upper limit voltage, the process proceeds to step S513; if not, the process returns to step S509 (step S512).

In step S513, the capacity calculator 164 calculates a capacity (full charge capacity) of the rechargeable battery 201 by subtracting a lower limit charged capacity $q_{lower}$ from the current charged capacity $q_n$ (i.e., a value within the range of $\pm \Delta q_n$ based a charged capacity when the open circuit voltage of the rechargeable battery 201 reaches an upper limit voltage, and the value is approximately equal to the upper limit charged capacity $q_{upper}$), and the capacity calculator 164 records the capacity in the calculation result database 173.

As explained above, the calculation apparatus according to the first embodiment calculates internal state parameters of a rechargeable battery first, and then, changes at least one of a quantity of active material of at least one of a cathode and an anode, and recalculates the at least one of the cathode and the anode. Thus, according to the calculation apparatus disclosed herein, it is possible to highly accurately estimate an internal state (particularly an initial charged capacity) of a rechargeable battery because a voltage change due to diffusion can be reproduced by an initial charged capacity calculation processing, although it is necessary to introduce a process of changing a quantity of active material to a fixed value and recalculating an initial charged capacity. The amount of calculation and the working area required for the initial charged capacity calculation processing are relatively small.

Figure 12:
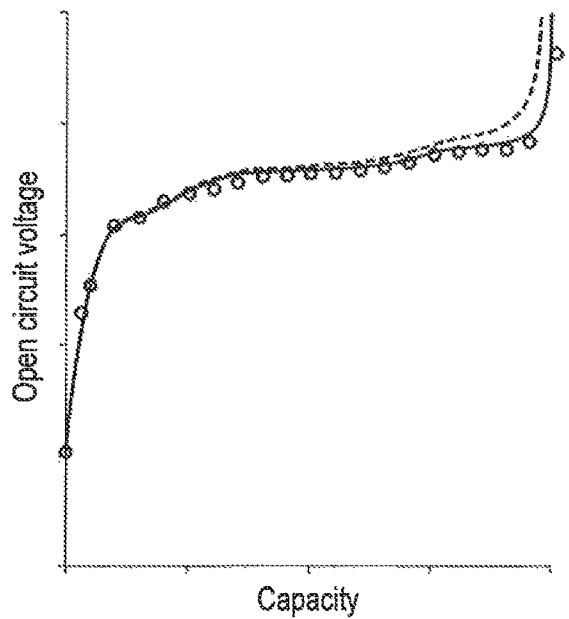
FIG. 12 is a graph illustrating the effect of the calculation apparatus shown in FIG. 1.
Figure 13:
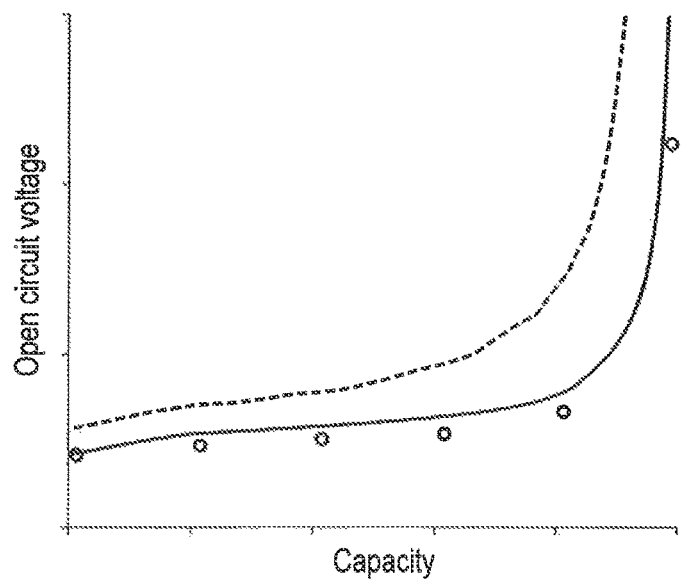
FIG. 13 is a partially-enlarged FIG. 12.

According to the calculation apparatus according to the first embodiment, it is possible to calculate characteristics of a rechargeable battery (e.g., open circuit voltages of a rechargeable battery corresponding to a plurality of charged capacities, a capacity of a rechargeable battery, etc.) based on an internal state of a rechargeable battery which is estimated with high accuracy. Specifically, FIG. 12 and FIG. 13, which is an enlarged drawing of FIG. 12, show an open circuit voltage curve (solid line) calculated based on internal state parameters in the case of performing the initial charged capacity calculation processing, an open circuit voltage curve (broken line) calculated based on the internal state parameters in the case of omitting the initial charged capacity calculation processing, and open circuit voltage values (circles) measured at the time of charging battery at a low rate. As shown in FIG. 12 and FIG. 13, open circuit voltages of a rechargeable battery corresponding to a plurality of charged capacities can be calculated with high accuracy by introducing the initial charged capacity calculation processing.

At least a part of the processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A battery system comprising:
    a lithium ion battery including a cathode and an anode;
    a current detector detecting a current flow in the lithium ion battery;
    a voltage detector detecting a terminal voltage between the cathode and the anode; and
    at least one processor that;
        receives, from the voltage detector, a plurality of voltage values representing a temporal change in the terminal voltage over a time period;
        receives, from the current detector, a plurality of current values at times within the time period;

performs a regression analysis on a predicted temporal change based on the plurality of current values and the plurality of voltage values to calculate internal state parameters including a quantity of active material of the cathode, a quantity of active material of the anode, an initial charged capacity of the cathode an initial charged capacity of the anode, and an internal resistance, wherein the regression analysis is performed so that the calculated internal state parameters minimize a sum of differences between the detected terminal voltages and estimated terminal voltages at the times within the time period, and the estimated terminal voltages are calculated based on the internal state parameters as variables and the detected current values;

calculates an open circuit voltage of the lithium ion battery based on a charged capacity of the lithium ion battery as a variable and the internal state parameters;

searches for a value of the charged capacity of the lithium ion battery when the calculated open circuit voltage reaches a predetermined upper limit voltage to obtain an upper limit charged capacity in a predetermined range based the value searched for;

modifies the calculated quantity of active material of a first electrode to a fixed value, wherein the first electrode corresponds to either the cathode or anode;

recalculates the initial charged capacity of the first electrode based on the calculated initial charged capacity of the first electrode, the quantity of active material of the first electrode modified to the fixed value, the upper limit charged capacity, and the originally calculated quantity of active material of the first electrode so that the open circuit voltage of the lithium ion battery corresponding to the upper limit charged capacity does not change before and after modifying the calculated quantity of active material of the first electrode to the fixed value;

uses the recalculated initial charged capacity and the upper limit charged capacity to determine a full charge capacity of the lithium ion battery; and outputs, to a display device, the full charge capacity of the lithium ion battery.

2. The system according to claim 1, wherein the at least one processor further calculates open circuit voltages of the lithium ion battery corresponding to a plurality of charged capacities based on the internal state parameters, the calculated quantity of active material of the first electrode, and the recalculated initial charged capacity.

3. The system according to claim 2, wherein the at least one processor further determines the full capacity of the lithium ion battery based on the internal state parameters, the calculated quantity of active material of the first electrode, and the recalculated initial charged capacity.

4. The system according to claim 1, wherein the anode contains graphite-type carbon or non-crystallized-type carbon as an anode material.

5. A calculation method for use on a lithium ion battery, the method comprising:

receiving, from a voltage detector detecting a terminal voltage between a cathode and an anode of the lithium ion battery, a plurality of voltage values representing a temporal change in the terminal voltage over a time period;

receiving, from a current detector detecting a current flow in the lithium ion battery, a plurality of current values at times within the time period;

performing a regression analysis on a predicted temporal change based on the plurality of current values and the plurality of voltage values to calculate internal state parameters including a quantity of active material of the cathode, a quantity of active material of the anode, an initial charged capacity of the cathode an initial charged capacity of the anode, and an internal resistance, wherein the regression analysis is performed so that the calculated internal state parameters minimize a sum of differences between the detected terminal voltages and estimated terminal voltages at the tunes within the time period, and the estimated terminal voltages are calculated based on the internal state parameters as variables and the detected current values;

calculating an open circuit voltage of the lithium ion battery based on a charged capacity of the lithium ion battery as a variable and the internal state parameters;

searching for a value of the charged capacity of the lithium ion battery when the calculated open circuit voltage reaches a predetermined upper limit voltage to obtain an upper limit charged capacity in a predetermined range based the value searched for;

modifying the calculated quantity of active material of a first electrode to a fixed value, wherein the first electrode corresponds to either the cathode and anode;

recalculating the initial charged capacity of the first electrode based on the calculated initial charged capacity of the first electrode, the quantity of active material of the first electrode modified to the fixed value, the upper limit charged capacity, and the originally calculated quantity of active material of the first electrode so that the open circuit voltage of the lithium ion battery corresponding to the upper limit charged capacity does not change before and after modifying the calculated quantity of active material of the first electrode to the fixed value;

using the recalculated initial charged capacity and the upper limit charged capacity to determine a full charge capacity of the lithium ion battery; and outputting, to a display device, the full charge capacity of the lithium ion battery.

6. The method according to claim 5, further comprising calculating open circuit voltages of the lithium ion battery corresponding to a plurality of charged capacities based on the internal state parameters, the calculated quantity of active material of the first electrode, and the recalculated initial charged capacity.

7. The method according to claim 5, wherein calculating the full capacity further comprises calculating the full capacity of the lithium ion battery based on the internal state parameters, the calculated quantity of active material of the first electrode, and the recalculated initial charged capacity.

8. The method according to claim 5, wherein the anode contains graphite-type carbon or non-crystallized-type carbon as an anode material.

9. The system according to claim 1, further comprising a communication interface that exchanges data with the voltage detector and the current detector of the lithium ion battery.

10. The method according to claim 5, further comprising exchanging data with the voltage detector and the current detector of the lithium ion battery via a communication interface.

* * * * *